(12) United States Patent
Osato et al.

(10) Patent No.: US 7,753,693 B2
(45) Date of Patent: Jul. 13, 2010

(54) CONTACTS AND ELECTRICAL CONNECTING APPARATUS USING THE SAME

(75) Inventors: Eichi Osato, Tokyo (JP); Hidekazu Miura, Cupertino, CA (US)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 30 days.

(21) Appl. No.: 12/237,289

(22) Filed: Sep. 24, 2008

(65) Prior Publication Data

US 2009/0104795 A1 Apr. 23, 2009

(30) Foreign Application Priority Data

Oct. 23, 2007 (JP) ............... 2007-275074

(51) Int. Cl.
*H01R 12/00* (2006.01)
(52) U.S. Cl. ..................................... 439/71
(58) Field of Classification Search ............. 439/71, 439/72, 73, 70
See application file for complete search history.

(56) References Cited

U.S. PATENT DOCUMENTS 7,303,404 B2 * 12/2007 Osato et al. ............. 439/71

2006/0183356 A1 * 8/2006 Kimura .................. 439/73

FOREIGN PATENT DOCUMENTS

JP 2003-123874 4/2003

OTHER PUBLICATIONS

Pat. Abstract of JP (2003-123874), Apr. 25, 2003, Micronics Japan Co. LTD.

* cited by examiner

*Primary Examiner*—Phuong K Dinh
(74) *Attorney, Agent, or Firm*—Ingrassia Fisher & Lorenz, P.C.

(57) ABSTRACT

An electrical connecting apparatus uses a plurality of contacts each of which includes: a principal portion having an outer face curved and directed to a conductive portion of a base plate and received in a recess and a slit of a housing; a front end portion continuous to the front end side of the principal portion and projected upward from the slit so as to be relatively pressed against an electrode of a device under test; and a rear end portion continuous to the rear end side of the principal portion and located in the recess. The front end portion of each contact is projected upward from the slit by the dimension of the thickness of the front end portion or more than that and has an arc-shaped front end face extend in the longitudinal direction of the slit.

9 Claims, 8 Drawing Sheets

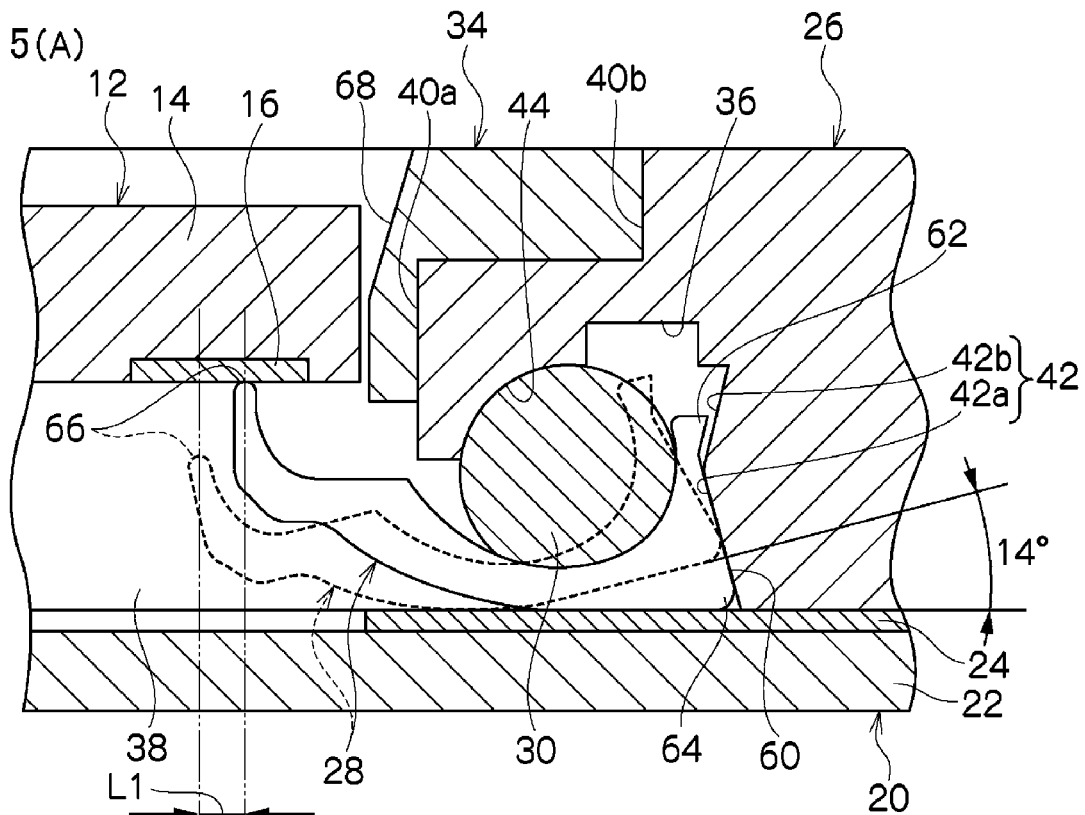
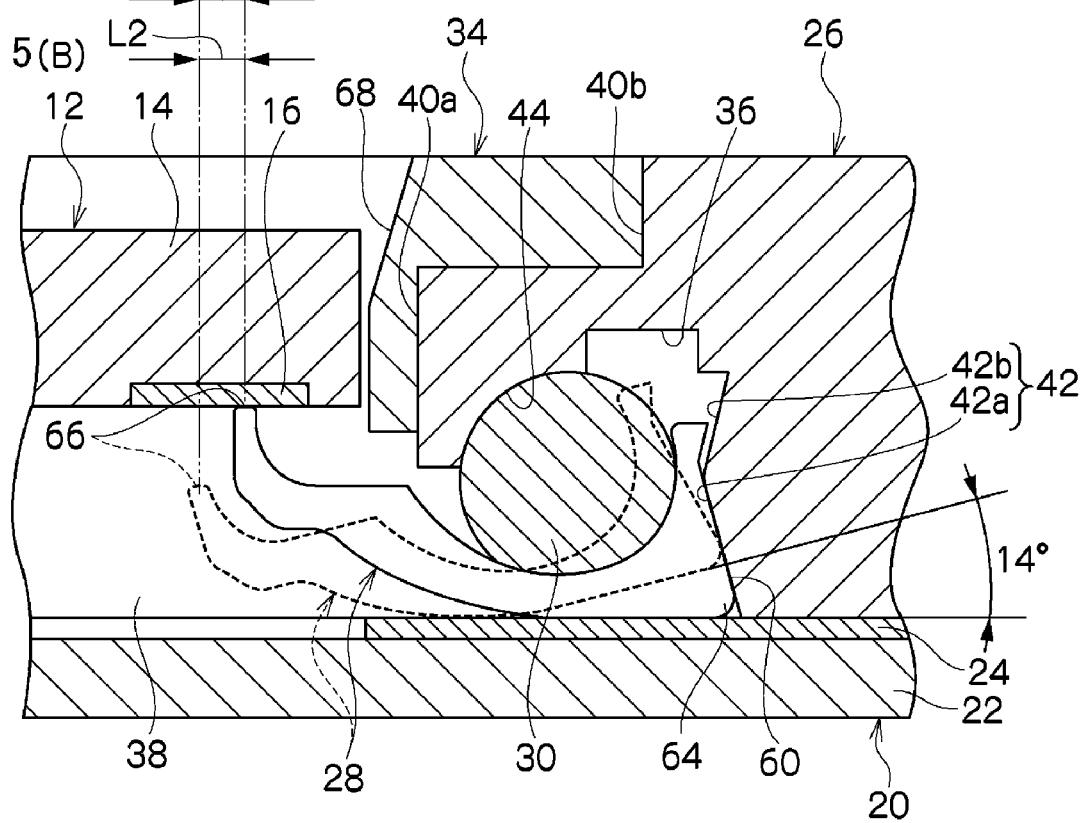

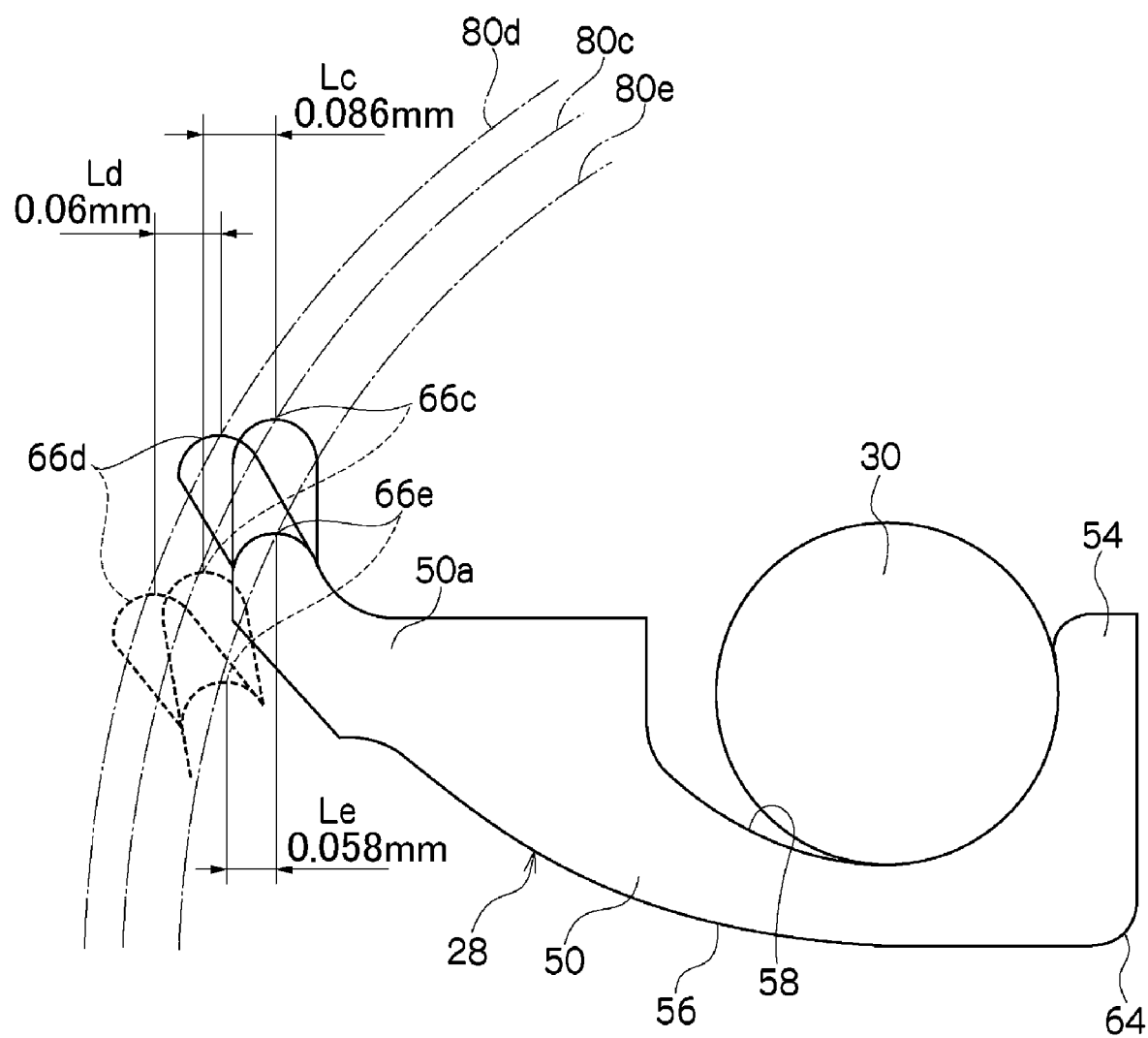

CONTACTS AND ELECTRICAL CONNECTING APPARATUS USING THE SAME

TECHNICAL FIELD

The present invention relates to a contact for use in an electrical test of a flat plate-like device under test such as an integrated circuit and an electrical connecting apparatus using the same, and more particularly, a contact for electrically connecting an electrically conductive portion formed on a base plate and an electrode of the device under test, as well as an electrical connecting apparatus using the contact.

BACKGROUND ART

A semiconductor device such as an integrated circuit has a plurality of electrodes projected from its device body. This type of semiconductor device is subjected to an electrical test, i.e., electrical characteristic test, by use of an electrical connecting apparatus called socket, as to whether or not it has a predetermined function. One of such electrical connecting apparatus is described, for example, in Patent Document 1.

[Patent Document 1] Japanese Patent Appln. Public Disclosure No. 2003-123874

The electrical connecting apparatus described in Patent Document 1 comprises: a plate-shaped housing to be assembled into a base plate which has a plurality of belt-like conductive portions such as part of wirings of a wiring pattern on the upside of an electrically insulating plate member; a plurality of plate-shaped contacts arranged in the housing in parallel to electrically connect the conductive portions of the base plate and the electrodes of the device under test; and a rod-shaped needle retainer i.e., needle presser disposed in the housing so as to extend in the arrangement direction of the contacts.

Such a connecting apparatus is attached to the upside of the base plate by a plurality of screw members screwed into the base plate such as a wiring board to penetrate the housing in its thickness direction.

The housing has a recess extending in a first direction within a horizontal plane and opening downward; a plurality of slits extending in a second direction orthogonal to the first direction at intervals in the first direction within a horizontal plane; and an opening which opens upward and downward and communicated at its lower end portion with the upper portions of the slits.

Each slit is communicated with the recess and the opening, respectively, at its rear end portion and front end portion in its longitudinal direction and opened at least downward.

Each contact includes a principal portion having a curved outer face and received in the recess and the slit of the housing so that the curved outer face may be directed to the conductive portion of the base plate; a front end portion continuous to the front end side of the principal portion and projecting from the slit into the opening of the housing so as to be pressed relatively against the electrode of the device under test; and a rear end portion continuous to the rear end side of the principal portion and located in the recess. The front end portion of each contact has an arc-shaped front end face extending in the second direction.

The needle retainer is made of a rubber material such as silicone rubber into a cylindrical shape and is disposed in the recess of the housing and made to abut a position opposite to the curved outer face of the contact so that a part of the curved outer face of the contact may be brought into contact with the conductive portion of the base plate.

Each contact has a part of the arc-shaped outer face abut the upside of the conductive portion of the base plate with the connecting apparatus assembled into the base plate and has its rear end face abut a rear-side inward face of the recess.

When the front end face of the front end portion of each contact and the electrode of the device under test is pressed relatively, an overdrive OD acts on the contact. Thereby, each contact, while compressing the needle retainer to elastically deform, angularly rolls over the upside of its conductive portion with the part of the curved outer face abutted on the conductive portion.

As a result, each contact scrapes away a part of an oxide film of the electrode of the device under test and electrically connects the electrode of the device under test to the conductive portion. In this state, a electrical test of the device under test is carried out.

In the above-mentioned electrical connecting apparatus, however, shavings resulted from scraping away a part of the oxide film of the electrode of the device under test are prone to accumulate in the front end face and its neighborhood of the contact. As a result, since the accumulated shavings, i.e., part of the oxide film are non-conductive, a contact resistance between the contact and the electrode becomes high, so that a correct electrical test cannot be conducted.

An experiment by the inventors of this application clarified that the foregoing is resulted because, in the conventional electrical connecting apparatus, an upward projecting dimension of the front end portion of the contact is small, and because the radius of curvature of the front end face is greater than the thickness of the plate-shaped contact.

BRIEF SUMMARY

Technical Problem

An object of the present invention lies in decreasing accumulation of shavings in the front end face and its neighborhood of the contact.

Solution to Problem

The contact according to the present invention comprises: a principal portion having a curved outer face directed to a conductive portion provided in a base plate; a front end portion continuous to the front end side of the principal portion and extending upward or diagonally from the front end side of the principal portion; and a rear end portion continuous to the rear end side of the principal portion. The front end portion is extended from the front end side of the principal portion by the dimension of the thickness of said contact or more than that and has an arc-shaped front end face extended in forward and backward direction or diagonally forward and backward direction so as to receive the device under test.

The front end face of the contact may have a radius of curvature of the dimension same or less than the thickness dimension of the contact. Also, the front end portion of the contact may have a front end area extending substantially vertically or inclined to the device under test received in the contact.

The front end area may have either a shape of which the width dimension in the front-back direction or in the diagonally front-back direction becomes substantially a constant value, or a shape of which the width dimension is reduced toward the front end side. Otherwise, the front end area may have a shape of which the width dimension of the front end area in the front-back direction or in the diagonally front-back direction is of substantially a constant value that is smaller than the thickness dimension of the contact.

The electrical connecting apparatus according to the present invention comprises: a housing having a groove-like recess extending in the front-back direction within a horizontal plane to open downward, and a plurality of slits extending in the right-left direction intersecting the front-back direction within the horizontal plane at intervals in the front-back direction, each slit being communicated with the recess on the side of the rear end portion and opening at least upward and downward; a plurality of contacts as mentioned above, the outer face of each of the contacts being directed to the conductive portion, the principal portion of each of the contacts being received in the recess and the slit, the front end portion of each of the contacts being projected upward from the slit so as to be relatively pressed against the electrode, and the rear end portion of each of the contacts being located in the recess; and a needle retainer disposed in the recess and abutting a position on the opposite side to the curved outer face of the contact so that a part of the curved outer face of the contact may be brought into contact with the conductive portion.

The recess can be provided with at least a rear-side inward face having an inclined face inclined to both a horizontal plane and a vertical plane such that the upper portion becomes forward. Also, the rear end portion of each contact may have a rear end directed toward the rear-side inward face of the recess and brought into contact with the inclined face at least partially.

The rear end of each contact may have an inclined face opposing the inclined face of the rear-side inward face and inclined to both of the horizontal plane and the vertical plane such that the upper portion becomes forward.

The inclined face of the rear-side inward face and the inclined face of each contact may be abutted on each other where the front end and the electrode is not pressed. In such a case, the lower corner portions of the rear end of each contact may be curved like an arc.

The rear-side inward face of the recess may further have, above the inclined face, a falling preventing portion for preventing the contact from falling out of the recess in cooperation with the rear end portion of each contact.

The falling preventing portion can include an engaging face withdrawn from the upper end of the inclined face of the falling preventing portion such that the upper portion becomes rearward. In such a case, the rear end of each contact can have at the upper portion of the inclined face of the contact a convex portion projecting rearward so as to engage with the engaging face.

The housing can further have an opening to open upward and to communicate with the upper portion of the slit at the lower end portion. In such a case, the front end portion of each contact may be projected into the opening.

The electrical connecting apparatus can further comprise a guide plate disposed in the opening of the housing and having a second opening for guiding the device under test such that its electrode abuts the front end of the contact.

Advantageous Effects of Invention

According to the present invention, since the front end portion having an arc-shaped front end face of the contact is extended from the front end of the main portion upward by a dimension same or more than the thickness dimension of the contact, the front end portion is projected upward by the dimension same or more than the thickness dimension of the contact even in a state that each contact is disposed in the housing to receive the device under test.

Thus, in a state that the front end face is pressed against the electrode of the device under test, a large space is kept under the electrode. Thereby, shavings resulted when the front end face is pressed against the electrode of the device under test is prone to fall out of the front end face and its neighborhood, and the accumulation of the shavings in the front end face of the contact and its neighborhood can be reduced. As a result, the contact resistance between the contact and the electrode is reduced to enable to carry out a correct electrical test.

When the front end face of each contact has the same radius of curvature as or smaller than the thickness of the contact, shavings surely fall out of the front end face and its neighborhood, to surely decrease the accumulation of the shavings on the front end face of the contact and its neighborhood and more surely reduce the contact resistance between the contact and the electrode, which results in a more accurate electrical test.

When the front end portion of each contact has a front end area extending vertically relative to the device under test received in the contact, shavings fall out of the front end face and its neighborhood more surely than when the front end portion is inclined to the opposite side of the rear end portion relative to the device under test to extend obliquely upward, the accumulation of the shavings on the front end face of the contact and its neighborhood is more surely reduced, and the contact resistance between the contact and the electrode is more surely reduced, which results in more accurate electrical test.

When the front end face of each contact is pressed against the electrode of the device under test, and when an overdrive acts on the contact, the contact angularly rotates about the needle retainer relative to the conductive portion of the base plate in a direction for the rear end portion to rise with the needle retainer elastically deformed and corner angle portion on its lower end side brought onto contact with the rear-side inward face of the recess.

Thus, when the inclined portion of the rear-side inward face of the recess is inclined such that its upper portion becomes forward relative to both horizontal plane and vertical plane to be brought into contact with at least a part of the rear end portion of the contact, each contact is displaced such that the rear end portion becomes upward to be prevented from withdrawing by above angularly rotation. As a result, sliding of the contact relative to the conductive portion of the base plate is reduced, which remarkably reduces wearing of the conductive portion and the contact.

Also, if the lower corner portion at the rear end of each contact is curved like an arc, when an overdrive acts on the contact, the contact is displaced by sliding of the contact portion of the contact relative to the inclined portion of the rear-side inward face, but the sliding of the contact portion of the contact relative to the inclined portion of the rear-side inward face becomes smooth.

BRIEF DESCRIPTION OF THE DRAWINGS

FIGS. 5(A) and (B) are enlarged sectional views obtained along the line 5-5 in FIG. 1, showing a state that an overdrive acts on the contact and a state that an over drive does not act thereon, in which FIG. 5(A) shows a state that the front end of the contact is not worn out, and FIG. 5(B) shows a state that the front end of the contact is worn out.

FIGS. 6(A) and (B) are views showing an embodiment of a position of the contact used in the electrical connecting apparatus shown in FIG. 1, in which FIG. 6(A) is a front view and FIG. 6(B) a plan view.

FIG. 8 is a view showing an experiment result of displacement amount of the front end face of the contact with other various front end portions relative to an electrode of a device under test.

DETAILED DESCRIPTION

Regarding Terms

Figure 1:
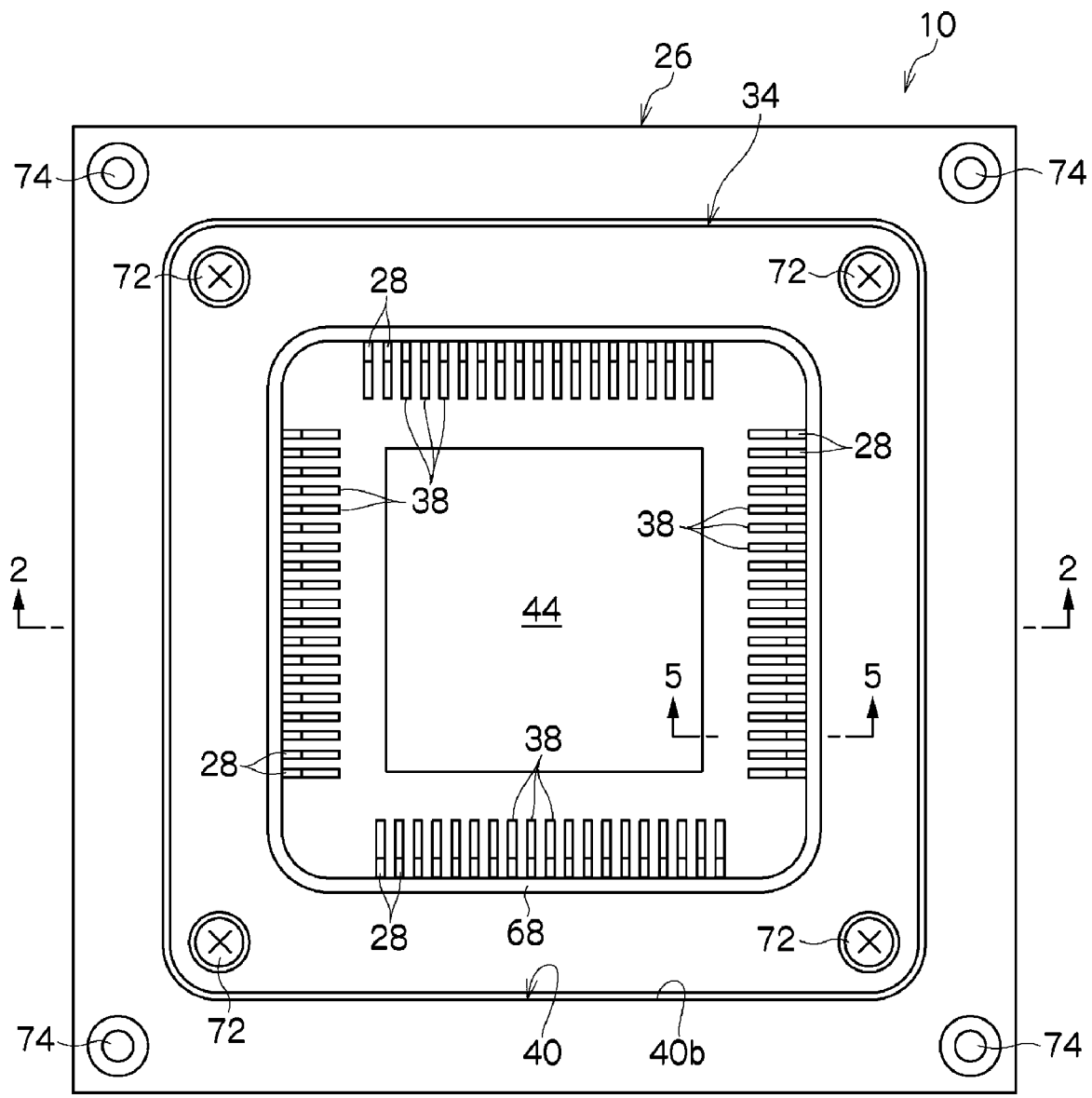
FIG. 1 is a plan view showing one embodiment of the electrical connecting apparatus according to the present invention.
Figure 2:
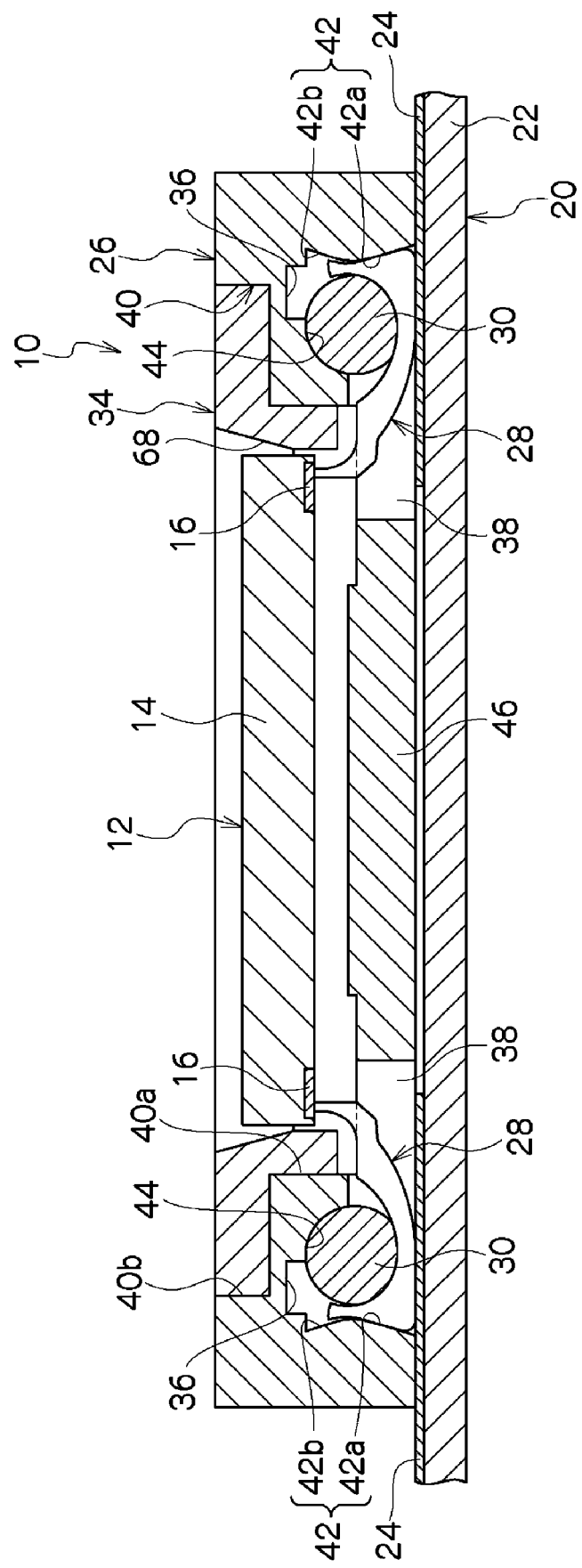
FIG. 2 is a sectional view obtained along the line 2-2 in FIG. 1.
Figure 3:
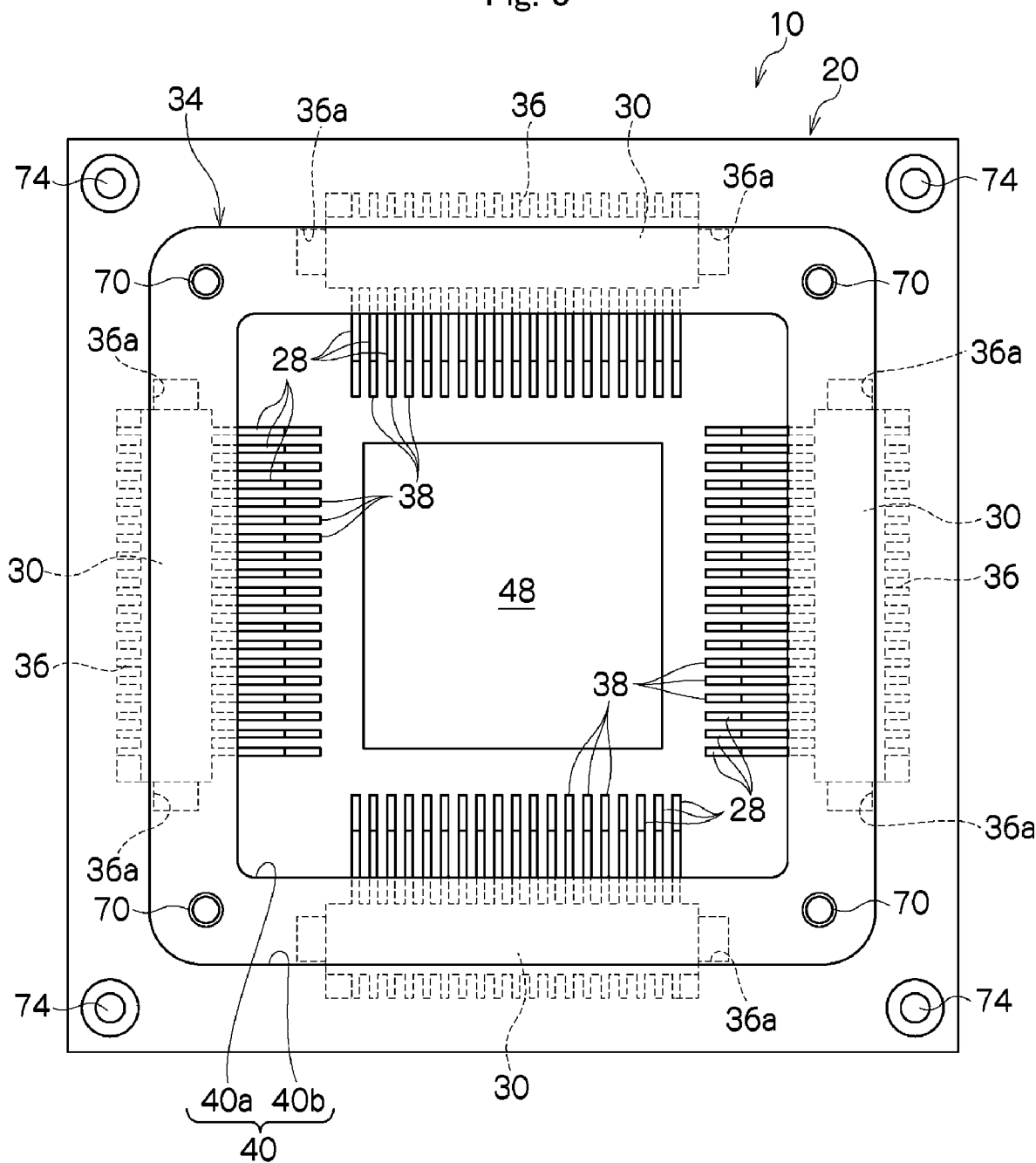
FIG. 3 is a plan view of the electrical connecting apparatus shown in FIG. 1 with a guide plate removed.

In the present invention, an alignment direction of slits described later is called a right-left direction (X direction), the longitudinal direction of the slits is called a front-back direction (Y direction), the up-down direction in FIG. 2 is called a vertical direction (Z direction), and a plane containing the X and Y directions are called a horizontal plane. These directions and plane are, however, different depending on attitudes of disposing the device under test on a testing apparatus.

Accordingly, the above-mentioned directions and plane may be determined such that the plane containing the X and Y directions becomes any one of the horizontal plane, an inclined plane inclined to the horizontal plane, and the vertical plane vertical to the horizontal plane, or becomes a combination of those planes.

In the present invention, the tip side of the contact is called a front side or forward side, and the opposite side to it is called a rear-end side or rearward side.

EMBODIMENT

Referring to FIGS. 1-6, an electrical connecting apparatus 10 is used as an auxiliary apparatus such as a socket for an integrated circuit (IC) in a electrical test (i.e., inspection) of a flat plate-like device under test 12. The device under test 12 is a packaged or molded integrated circuit in the illustration, but it may be a not packaged or not molded semiconductor device.

As shown in FIG. 2, the device under test 12 has a body 14 shaped like a rectangular plate, and a plurality of electrodes 16 provided at each side of the rectangle on one face of the body 14. Each electrode 16 is strip-shaped. The electrodes 16 are divided into four electrode groups made to correspond to each side of the rectangle of the body 14 in one-to-one relationship, and are arranged in parallel in each electrode group so as to extend in a direction intersecting (orthogonal to, in the illustration) the corresponding side.

A base plate 20 such as a wiring board to assemble the connecting apparatus 10 therein is, as shown in FIGS. 2, 5(A) and 5(B), a wiring board with a conductive wiring pattern formed by printed wiring technique on one surface of a plate material 22 made of electrically insulating material such as glass-mixed epoxy resin, each of which has a plurality of belt-like wiring portions, i.e., conductive portions 24, made to correspond to the electrodes 16 of the device under test 12 in one-to-one relationship on one surface of the plate material 22.

Each conductive portion 24 is a part of the wiring pattern. The conductive portions 24 are divided into four conductive portion groups made to correspond to each side of the rectangle of the body 14 of the device under test 12, and, in the neighborhood of the corresponding side, extend in a direction intersecting (orthogonal to, in the illustration) the corresponding side and are formed in parallel in each conductive group in a state of being spaced apart in the longitudinal direction of the corresponding side.

The base plate 20 is generally manufactured according to the kind of the testing apparatus to assemble the device under test 12 or the kind of the device under test 12 to be inspected by a user to conduct a electrical test of the device under test 12. However, the base plate 20 may be manufactured on the side of a manufacturer of the connecting apparatus 10.

The connecting apparatus 10 comprises: a rectangular plate-shaped housing 26 to be assembled into the base plate 20; a plurality of contacts 28 arranged in parallel to the housing 26 and corresponding to sets of the electrodes 16 and the conductive portions 24 in one-to-one relationship; four long needle retainers 30 arranged in the housing so as to be brought into contact with the contacts 28; and a guide plate 34 disposed in the housing 26.

The housing 26 has: four groove-like recesses 36 extending in a first direction or a second direction within the horizontal plane parallel to the base plate to intersect each other; a plurality of slits 38 extending in the second or the first direction within the horizontal plane at intervals in the first or the second direction; and an opening 40 provided in a central area of the housing 26 to open upward.

Each recess 36 is made to correspond to each side of the body 14 of the device under test in one-to-one relationship and extends in the longitudinal direction (in the first or the second direction) of the corresponding side. The rear-side inward face 42 forming each recess 36 has at its lower portion an inclined face 42a inclined to both of the horizontal plane and the vertical plane vertical thereto, and has at its upper portion a falling preventing portion 42b for preventing the contact 28 from falling out of the housing 26.

The inclined face 42a is formed as an obliquely downward plane inclined to the base plate 20 such that the upper portion becomes the forward side. The falling preventing portion 42b is formed as an obliquely upward plane inclined such that the upper portion becomes the rearward side and is withdrawn from the upper end of the inclined face 42 so as to prevent the contact in cooperation with the rear end portion of the contact 28 from falling out of the recess 36. For this reason, the rear-side inward face of the recess 36 is projected forward.

Figure 4:
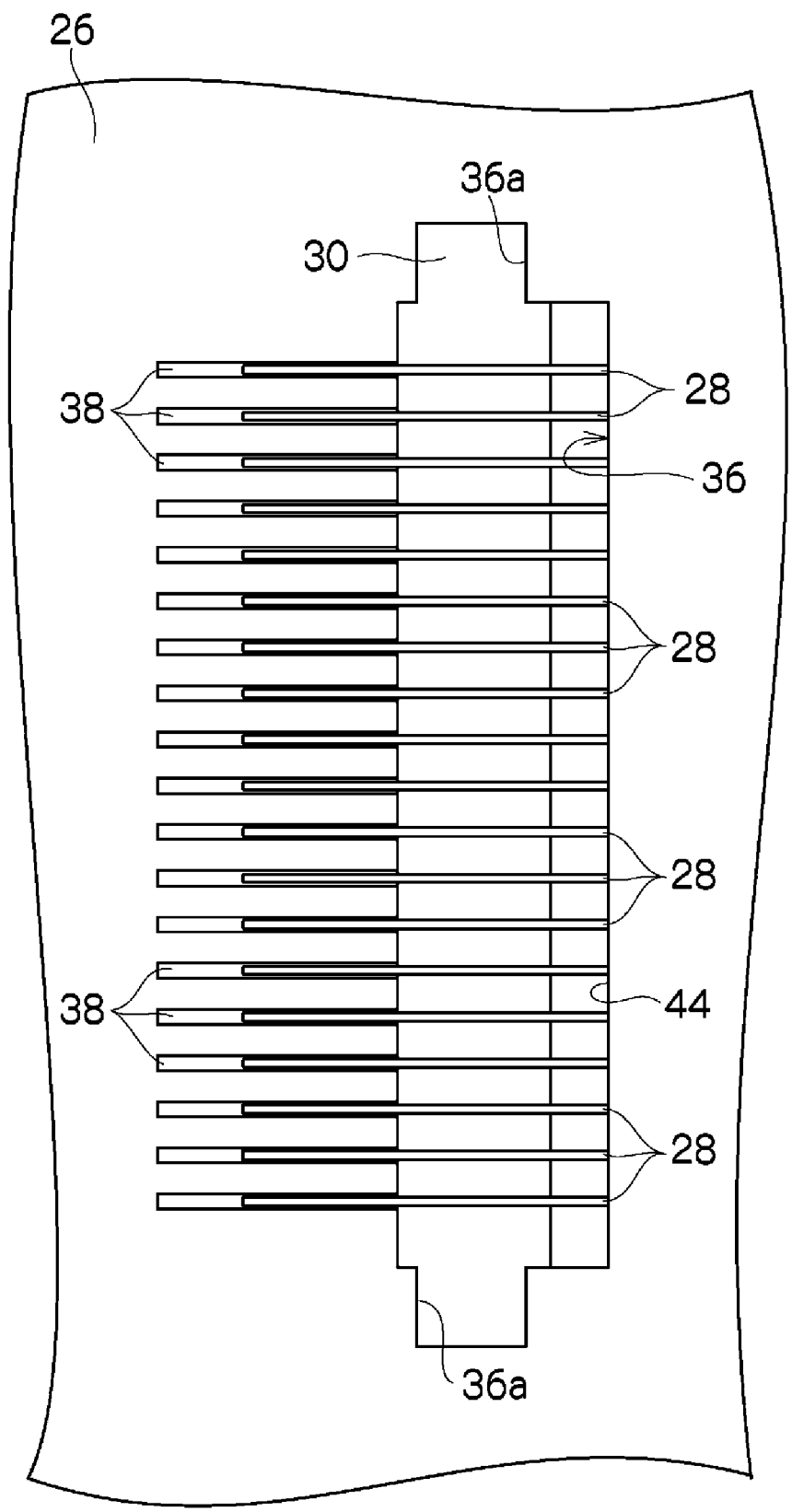
FIG. 4 is an enlarged bottom view in the neighborhood of the contact of the electrical connecting apparatus shown in FIG. 1.

The upper corner portion on the front end side of each recess 36 is formed as an arc-shaped surface 44. As shown in FIG. 4, both end portions 36a of each recess 36 are formed as U-shaped grooves. An intermediate area of each recess 36 is formed as a length area same or longer than the area where the slits 38 of the corresponding slit group are arranged.

Each longitudinal end portion (i.e., the U-shaped groove) 36a of the recess 36 has a smaller radius of curvature than the width dimension of the portion of the intermediate region of the recess 36 and a center of curvature which coincides with the center of curvature of the arc-shaped surface 44 so that the end portion of the needle retainer 30 may be fitted in a close-fit state.

The central area of the housing 26 is formed as a plate-like portion 46 having a rectangular shape as seen in a plane.

The slits 38 are divided into four slit groups made to correspond to a set of each side of the rectangle of the body 14 of the device under test 12 and the recess 36 in one-to-one relationship. The slits 38 of each slit group extend in a direction (in the illustration, the front-back direction or the right-left direction) intersecting (in the illustration, orthogonal to) the corresponding side at intervals in the longitudinal direction of the corresponding side and the recess 36. The portions between the adjacent slits of each slit group are made diaphragms.

Each slit 38 is opened upward and downward of the housing 26, and is communicated at one end side (rear end side) in the longitudinal direction with the lower portion on the front end side of the corresponding recess 36 as well as at the upper portion of the other end side (front end side) in the longitudinal direction with the opening 40.

The opening 40, as seen in a plane, has a small first recess area 40a around the plate-like portion 46 of the housing 26 and a second recess area 40b continuous to the upper portion of the first recess area 40a and larger than the first recess area 40a.

The first and second recess areas 40a and 40b are, when seen as a plane, have rectangular shapes analogous to the body 14 of the device under test 12, and are formed to be co-axial and analogous figures. The slits 38 have their front end sides open at one side of the rectangle of the first recess area 40a in each slit group.

The area around the plate-like portion 46 of the housing 26 is made lower than the second recess area 40b by the first recess area 40a of the opening 40. The area around the plate-like portion 46 of the housing 26 has a shape of a rectangle frame and a crank-like sectional shape.

Such a housing 26 as above can be made of an electrically insulating material such as a synthetic resin.

Figure 6A:
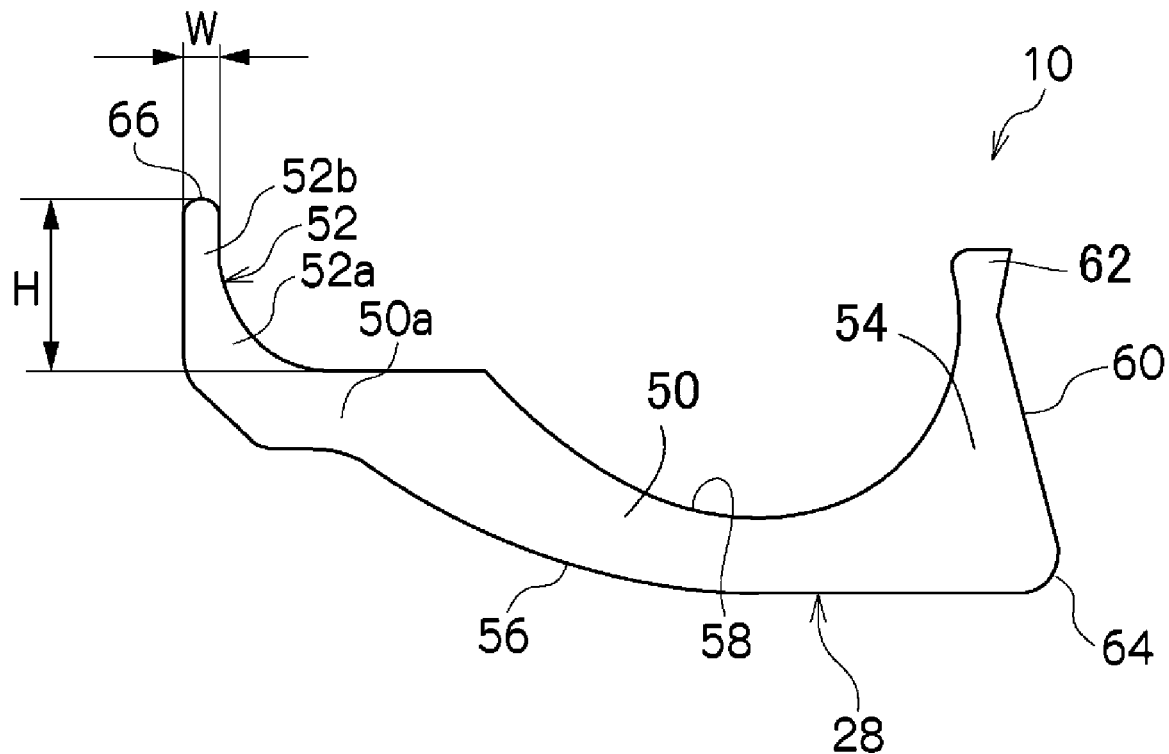
Figure 6B:
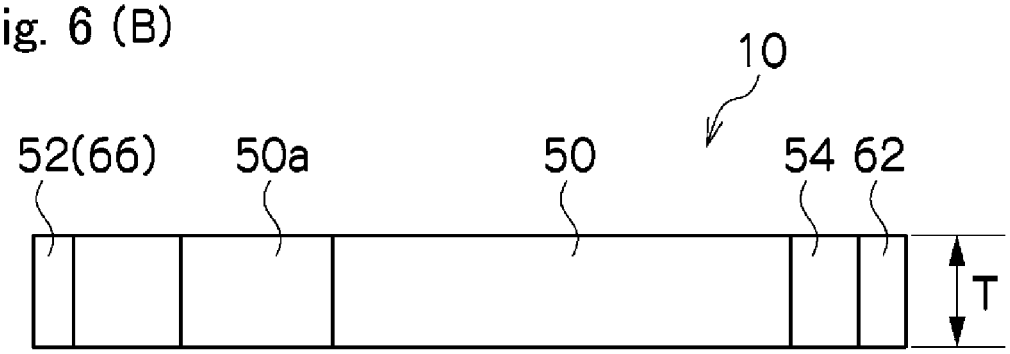

Each contact 28 is formed as a plate-like contact having a constant thickness dimension T. As shown in FIG. 6, each contact 28 is provided with a principal portion 50 received in the recess 36 and the slit 38, a front end portion 52 following the front end side of the principal portion 50 and projecting from the slit 38 into its upper opening 40, and a rear end portion 54 continuous to the rear end side of the principal portion 50 and located in the recess 36.

The principal portion 50 is curved from the rear end portion 54 toward the front end portion 52. For this reason, the principal portion 50 has, at its rear end side, an outer face 56 directed toward the conductive portion 24, and an arc-shaped recess 58 opening upward. An area 50a on the front end side of the principal portion 50 extends toward a front end portion 52 substantially horizontally.

Each contact 28 is disposed in the housing 26 in a state that its outer face 56 is on the lower side, the rear end portion 54 is located within the recess 36, the principal portion 50 extends in an arc-like shape from the recess 36 within the slit 38, and that at least a part of the front end portion 52 is projected from the inside of the slit 38 to the first recess area 40a of the opening 40.

The rear end portion 54 of each contact 28 has an inclined portion 60 at the lower portion and a convex portion 62 at the upper portion. The lower corner portion of each contact 28 is formed as an arc-shaped convex surface, i.e., convex arc-shaped surface 64.

The inclined portion 60 of the contact 28 is formed as an obliquely upward inclined face such that the upper portion becomes the forward side so as to be able to abut the inclined portion 42a of the rear-side inward face of the recess 36. The convex portion 62 is projected rearward from the upper end of the inclined portion 60 so as to be engaged with the falling preventing portion 42b of the recess 36, and forms an obliquely downward inclined face such that the upper portion becomes the rear side. Both inclined faces of the inclined portion 60 and the convex portion 62 cooperatively form the rear end face of the contact 28.

The principal portion 50 of each contact 28 acts as an arm portion which elastically deforms when the electrode 16 of the device under test 12 is pressed against the front end portion 52. In the illustration, such an arm portion extends obliquely upward like an arc from the inside of the recess 36 within the slit 38 substantially horizontally forward and is curved further toward the front end portion 52.

The rear end face of each contact 28 is brought into contact with the inclined face 42a of the recess 36 in the inclined face of the rear end portion 60 except the convex portion 62 and the arc-shaped surface 64. The convex portion 62 abuts the falling preventing portion 42b of the recess 36.

The front end portion 52 of each contact 28 is projected upward from the slit 38 by a dimension larger than the thickness dimension of the contact 28 to be curved obliquely upward in the area 52a on the side of the principal portion 50.

The upper front end area 52b nearer a front end face 66 than the lower front end area 52a of each front end portion 52 extends substantially vertically relative to the device under test 12 received in the connecting apparatus 10 in a state that no overdrive OB acts on the contact 28 and has a front end face 66 extending in the longitudinal direction of the contact 28. In the illustration, the front end face 66 is an arc-shaped surface projecting upward, and has a radius of curvature R substantially the same as or less than the thickness dimension of the front end portion 52.

The front end portion 52 is projected from the principal portion 50 by a projecting dimension H larger than the thickness dimension T of the contact 28, the front end face 66 having a radius of curvature R smaller than the thickness dimension T, and the upper front end area 52b has a width dimension W in the first or second direction smaller than the thickness dimension T.

These values T, H, R and W, respectively, may be as large as 0.15 mm, 0.2 mm, 0.025 mm and 0.05 mm. These values T, H, R and W are determined by the size and shape of the contact 28, the size and shape of the electrode 16 of the device under test 12, and by the arrangement pitch and the like of the electrodes 16.

The thickness dimension T, in particular, varies greatly according to an arrangement pitch of the electrodes 16 in the device under test.

The projecting dimension H of the front end portion 52 from the slit 38 can be made 1-3 times, preferably 1-2 times, more preferably, 1.5 times as much as the thickness dimension of the contact 28, particularly, of the front end portion 52.

The width dimension W of the upper front end area 52b of each contact 28, particularly of a part nearest to the front end face 66 can be made 0.1-1.0, preferably 0.1-0.5, more preferably 0.3 times as much as the thickness dimension T of the contact 28, particularly of the front end portion 62.

The radius of curvature R of the front end face 66 of each contact 28 can be half the width dimension W of a part nearest to the front end face 66.

In the illustration, the upper front end area 52b of the front end portion 52 has a configuration of which the width dimension W is of substantially a constant value, while the width dimension W becomes smaller toward the side of the front end face 66.

The contact 28 such as above can be made of a conductive metal material excellent in spring property and toughness such as nickel, nickel alloy like nickel tin and nickel silver, rhodium or the like.

The needle retainers 30 have a circular rod-like shape in section by an elastically deformable elastic member like a silicone rubber and are made to correspond to the sets of the rectangular side and recess 36 in one-to-one relationship.

Each needle retainer 30 extends in the longitudinal direction of the corresponding recess 36 within the corresponding recess 36.

As shown in FIG. 4, both end portions of each needle retainer 30 has a smaller diameter than the intermediate area of the needle retainer 30 and are fitted in a state of close fit into both end portions 36a of the corresponding recess 36. Thus, each needle retainer 30 is prevented from falling out of the housing 26.

The intermediate area between both end portions of each needle retainer has a radius which is substantially the same radius as the radius of curvature of the arc-shaped surface 44 of the upper corner portion on the front end side of the recess 36, is brought into contact with the arc-shaped surface 44 of the upper corner portion on the front end side of the recess 36, and abuts the recess 58 of the contact 28 of the corresponding contact group.

The guide plate 34 has a rectangular shape analogous to the opening 40 and is disposed within the opening 40. The guide plate 34 has a rectangular opening 68 for receiving the device under test 12 such that its electrode 16 abuts the front end portion 52 of the contact 28.

The opening 68 is somewhat larger than the device under test 12, has a rectangular planar shape analogous to the body 14 of the device under test 12 and opens upward and downward. The upper-half portion of the inward face which forms the opening 68 is made a small inclined face directed to the center side of the guide plate 34 and smaller toward the lower side.

The connecting apparatus 10 can be assembled as follows.

First, after each needle retainer 30 is disposed in the recess 36, the contacts 28 of each contact group are arranged in the housing 26 in such a state that each front end portion 52 and the principal portion 50 are passed through the corresponding slit 38 from the corresponding recess 36, that the front end portion 52 is projected into the opening 40 and the inclined face of the inclined portion 60 is brought into contact with the incline face 42a of the rear-side inward face 42. Thus, each contact 28 is held, at its rear end portion 54, in the housing 26 by the needle retainer 30, and is prevented from falling out of the housing by the falling preventing portion 42b and the convex portion 62.

Next, the guide plate 34 is disposed in a second recess area 40b of the opening 40. The guide plate 34 is removably fixed on the housing 26 by a plurality of screw members 72 screwed into screw holes 70 (see FIG. 3), penetrating the guide plate 34 in its thickness direction.

As mentioned above, the connecting apparatus 10 is assembled decomposably. For decomposing the assembled connecting apparatus 10, an operation reverse to the above is performed.

In a state of being assembled into the connecting apparatus 10, the arm portion of each contact 28 extends from the inside of the recess 36 within the slit 38 obliquely upward and forward in an arc state as shown in FIG. 5(A), the front end portion 52 is projected into the opening 40, the front end face 66 of the front end portion 52 is located within the opening 40 of the housing 26 and within the opening 68 of the guide plate 34.

However, since the device under test 12 is received within the opening 68 of the guide plate 34, each contact 28 may have a shape that the front end portion 52 is not located within the opening 68.

The connecting apparatus 10 as assembled is separably incorporated in a surface having the conductive portion 24 of the base plate 20 by a plurality of screw members 74 to be screwed into the base plate 20, extending through the housing 26.

In a state that the connecting apparatus 10 is incorporated in the base plate 20 as mentioned above, the contact 28 is brought into contact with the conductive portion 24 of the base plate 20 at a part of the outer face 56 by the needle retainer 30 so as to be maintained in that state. By this, the contact 28 is surely prevented from falling out of the housing 26, so that the contact 28 and the conductive portion 24 are surely connected electrically.

As mentioned above, if both end portions of the needle retainer 30 are fitted into both end portions of the recess 36 in a close-fit state and also if the central area of the retainer 30 is brought into contact with the recess 58 of the contact 28, the position and attitude of the contact 28 relative to the housing 26 becomes stable, thereby surely preventing the contact 28 from falling out of the housing 26.

At the time of inspection, the device under test 12 is placed in the opening 68 of the guide plate 34 from above. At this time, if the position of the device under test 12 relative to the connecting apparatus 10 is deviated, the device under test 12 abuts the inclined upper-half portion of the inward face forming the opening 68 and is guided to the center of the opening 68 by the inclined face. Thus, the device under test 12 is accommodated in the connecting apparatus 10 in a state that the electrode is brought into contact with the front end face 66 of the contact 28.

When the device under test 12 disposed in the connecting apparatus 10 is pressed down by a pressing body not shown, each contact 28 is rotated angularly around the needle retainer 30 in a state that a part of the outer face 56 is pressed against the conductive portion 24 by the overdrive OD and, while it deforms under compression the needle retainer such that the needle retainer 30 is crushed from the rear side to the front side, is angularly rotated around the needle retainer 30 from the attitude indicated by a solid line to the attitude indicated by a dotted line (namely, the rear end of the contact 28 is displaced upward).

Thus, the contact position of the contact 28 and the conductive portion 24 displaces forward by a predetermined distance. At this time, by a reaction force of the needle retainer 30, a force to make the contact withdraw along its outer face 56 acts on the contact 28.

However, since the inclined face 42a of the rear-side inward face 42 is inclined obliquely downward relative to both horizontal plane and vertical plane such that the upper part of the inclined face 42a becomes forward, the contact 28 abuts the inclined face 42a, and then, the arc-shaped surface 64 is displaced upward relative to the inclined face 42a, thereby preventing the arc-shaped surface 64 from withdrawing due to the reaction force of the needle retainer 30. Therefore, sliding of the contact relative to the conductive portion 24 is reduced, thereby remarkably reducing wearing of the conductive portion 24 and the contact 28.

When the overdrive OD acts on the contact 28, the contact 28 is displaced by sliding of the contact position of the contact 28 relative to the inclined portion 42a of the rear-side inward face 42, but since the lower corner portion of the rear end of each contact 28 is formed as an arc-shaped surface 64, the contact position of the contact 28 with the inclined face 42a smoothly slides relative to the inclined face 42a of the rear-side inward face 42, so that the contact revolves surely.

However, since the rear end face of each contact 28 directly contacts the inclined face 42a of the inward rear-end face 42 of the recess 36, each contact 28 displaces as indicated by a dotted line in FIG. 5(A) with the arc-shaped surface 64 as a fulcrum and elastically deforms the needle retainer 30.

Thus, since the front end face 66 is greatly displaced forward relative to the electrode 16 by a distance L1 and the contact position of the contact 28 with the conductive portion 24 changes to the side of the front end portion 52, the front end portion 52 of each contact 28 causes a rubbing action (or scraping action) to shave off a part of the oxide film existing on the surface of the electrode 16.

As mentioned above, when the device under test is pressed down by the pressing body, each contact 28 is pressed against the conductive portion 24; therefore, there can be a gap between the contact and the conductive portion 24 such that each contact 28 is not pressed against the conductive portion 24 by the needle retainer 30 in a state of being assembled into the connecting apparatus 10 or in a state that the device under test 12 cannot be pressed down by the pressing body.

The angle of the inclined portion 60 to the vertical plane can have such a value as, however deformed the front end portion 52 would be, a part of the rear end of the contact 28, particularly, the arc-shaped surface 64 of the lower corner portion is always in contact with the inclined face 42a, and besides, the contact point between the conductive portion 24 and the contact 28 is changed not to cause the contact 28 to slide relative to the conductive portion 24.

The angle of the inclined portion 60 of the contact 28 to the vertical plane may be the same as or larger than the angle of the inclined face 42a to the vertical plane. In other words, it is sufficient that the angle of the inclined portion 60 to the vertical plane is the same as or larger than the angle of the inclined face 42a to the vertical plane. Alternatively, it is possible to form the corresponding portion as an arc-shaped face in place of forming the inclined portion 60 having an obliquely downward inclined face at the rear end of the contact 28.

In the connecting apparatus 10, since the front end portion 52 of each contact 28 is greatly projected upward from the slit 38, a large space is formed under the device under test 12, particularly between the device under test 12 and the principal portion 50 of the contact 28. Thus, shavings resulted, when the front end face 66 of each contact 28 is pressed against the electrode 16 of the device under test 12, fall out of the front end face 66 and reduces accumulation of the shavings in the front end face 66 and its neighborhood, thereby surely reducing the contact resistance between the contact 28 and the electrode 16, which results in an accurate electrical test.

Also, if the front end face 66 of each contact 28 has a radius of curvature same or less than the thickness dimension of the contact, shavings surely fall out of the front end face 66, and the accumulation of the shavings in the front end face 66 and its neighborhood is surely reduced, thereby more surely reducing the contact resistance between the contact 28 and the electrode 16, which results in a more accurate electrical test.

Furthermore, if the front end portion 52 of each contact 28 is extended substantially vertically to the device under test 12 received in the contact 28, the shavings fall more surely out of the front end face 66, and the accumulation of the shavings in the front end face 66 and its neighborhood is more surely reduced, thereby reducing the contact resistance between the contact 28 and the electrode 16 more surely, which results in a more accurate electrical test.

If such an electrical test as above is repeated, the front end face 66 of the contact 28 wears out as shown in FIG. 5(B) by scraping action between the front end face 66 and the electrode 16. However, an amount of forward displacement of the front end face 66 relative to the electrode 16 when an overdrive acts on the contact 28 decreases only slightly by the distance L2. Both FIGS. 5(A) and (B) show by a dotted line a state when the contact 28 is angularly rotated from a state indicated by a solid line by 14°.

Figure 7:
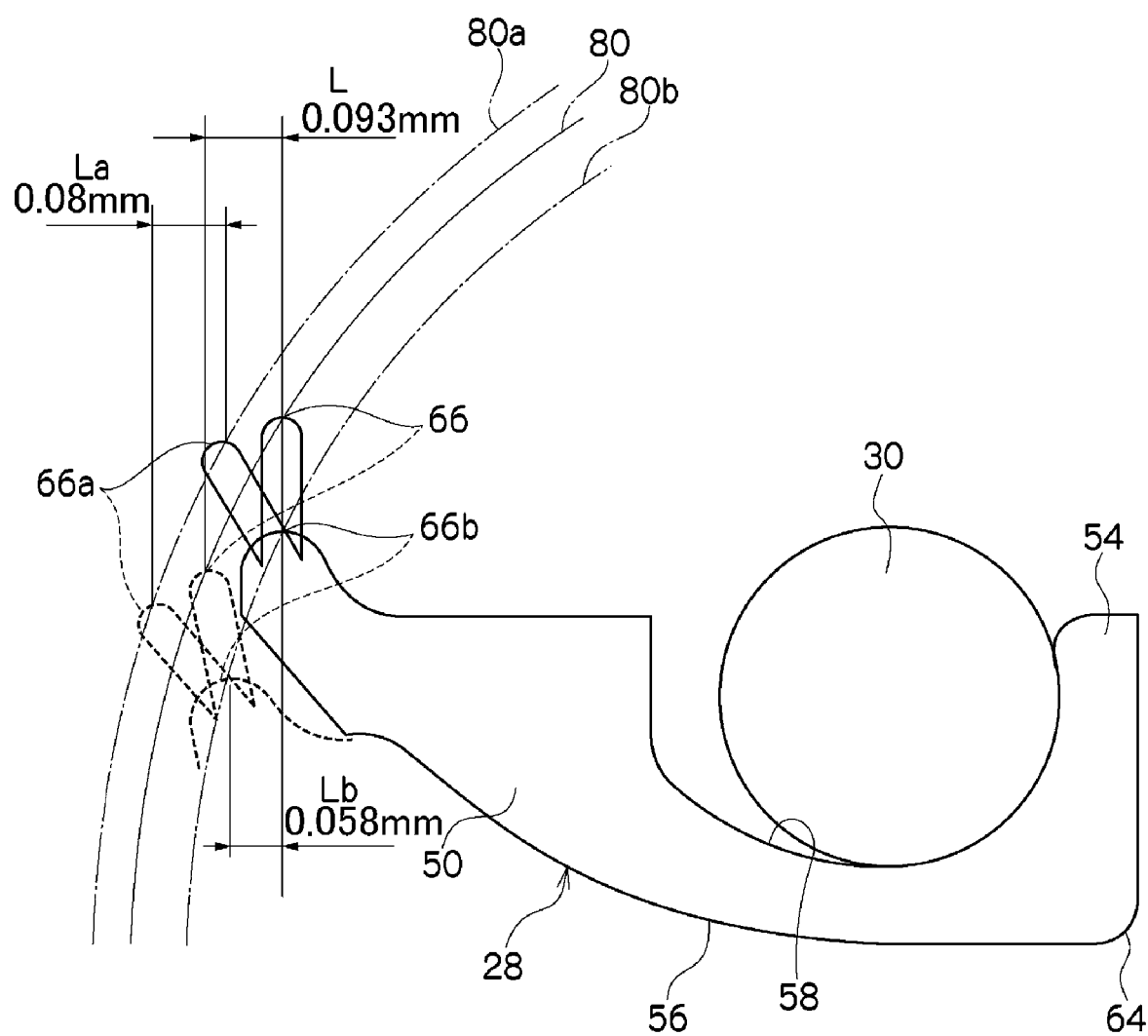
FIG. 7 is a view showing an experiment result of displacement amounts of the front end face of the contact with various front end portions relative to an electrode of a device under test.

FIG. 7 shows an experiment result of measuring amounts of forward displacement L, La and Lb of the front end faces 66, 66a and 66b of various kinds of contacts 28 relative to the electrodes when an overdrive acts on the contacts. In any case, by making the overdrive act on the contact, the contact was angularly rotated from the state where the contact is indicated by the solid line to the state where it is indicated by the dotted line by 14°.

The configurations and the like of the respective contacts 28 are the same as those already mentioned except the front end portions. The front end portions having the front end faces 66 and the front end portions with the front end faces 66a have the same configurations and the same dimensions as T, H, W and R (see FIG. 6).

The front end portion having the front end face 66 is largely extended vertically to the device under test. The dimensions T, H, W and R of the front end portion having the front end face 66 were, respectively, 0.15 mm, 0.16 mm, 0.05 mm and 0.025 mm.

The front end portion having the front end face 66a is extended greatly obliquely upward toward the front side. The dimensions T, H, W and R of the front end portion having the front end face 66a were, respectively, 0.15 mm, 0.16 mm, 0.05 mm and 0.025 mm.

The front end portion having the front end face 66b is vertically extended relative to the device under test and has substantially the same radius of curvature and width dimension W as the thickness dimension T of the front end portion 52, but those of the front end portion having the front end faces 66 and 66a have different amount of extension, dimensions and configuration as shown in FIG. 7. The dimensions T, H, R and W of the front end portion having the front end face 66b were, respectively, 0.15 mm, 0.078 mm, 0.1 mm and 0.05 mm.

In FIG. 7, curves 80, 80a and 80b shown by dashed lines respectively show a trajectory of movement of the vertexes of the front end faces 66, 66a and 66b.

From the experiment result in FIG. 7, it has become clear that the amounts of displacement L, La and Lb, respectively, of the front end faces are as follows: in the front end portion having the front end face 66, L=0.093 mm, which is the largest; in the front end portion having the front end face 66a, La=0.08 mm, which is the second largest; and in the front end portion having the front end face 66b, Lb=0.058 mm, which is the smallest.

FIG. 8 shows an experiment result of the measurement of the amounts of forward displacements Lc, Ld and Le of the front end faces 66c, 66d and 66e, respectively, of another various contacts 28 relative to the electrode when the overdrive acts on the contacts. In any case, the contact was angularly rotated by 14° from the state as indicated by a solid line to the state indicated by a dotted line.

The configurations and the like of the respective contacts are the same as those already mentioned except the front end portions. Also, the front end portions of the respective contacts 28 have the same dimensions T, R and W except for the projecting direction and projecting dimension H.

The front end portion having the front end face 66c is greatly extended vertically to the device under test. The dimensions T, H, W and R of the front end portion having the front end face 66 were, respectively, 0.15 mm, 0.2 mm, 0.1 mm and 0.5 mm.

The front end portion having the front end face 66*d* is greatly extended obliquely upward toward the front side. The dimensions T, H, W and R of the front end portion having the front end face 6*d* were, respectively, 0.15 mm, 0.167 mm, 0.1 mm and 0.5 mm.

The front end portion having the front end face 66*e* is greatly extended vertically relative to the device under test likewise as in case of the front end portion having the front end face 66*c*. The dimensions T, H, W and R of the front end portion having the front end face 66*e* were, respectively, 0.15 mm, 0.078 mm, 0.1 mm and 0.5 mm.

In FIG. 8, the curves 80*c*, 80*d* and 80*e* indicated by dotted lines respectively show the trajectories of movement of the vertexes of the front end faces 66*c*, 66*d* and 66*e*.

From the experiment result shown in FIG. 8, it has become clear that the amounts of displacement Lc, Ld and Le, respectively, of the front end faces are as follows: in the front end portion having the front end face 66*c*, Lc=0.086 mm, which is the largest; in the front end portion having the front end face 66*d*, Ld=0.06 mm, which is the second largest; and in the front end portion having the front end face 66*e*, Le=0.058 mm, which is the smallest.

In view of both experiments, it has become clear that the greater the amount of displacement of the front end face, the larger the amount of shavings by a single displacement of the front end face becomes, but the shavings adhered to the front end face and its neighborhood are likely to fall out of the front end face and its neighborhood, that the smaller the front end portion 52, particularly the width dimension of the portion on the side of the front end 66 (the longitudinal dimension of the slit 38) is, the shavings are likely to fall out of the front end face 66, and that the smaller the radius of curvature of the front end face 66 is, the shavings are likely to fall out of the front end face 66.

It has become clear that, particularly when the front end portion 52 is projected vertically to the device under test 12, the foregoing effect is shown distinctly.

In the present invention, however, the front end portion 52 is projected upward from the slit 38 more greatly than the thickness dimension T of the contact 28, and in case of the arc-shaped front end face 66 extending longitudinally of the slit 38, the front end portion 52 may be extended obliquely relative to the device under test 12. In this case, the angle of inclination of the front end portion 52 to the device under test 12 is preferably 45° or less from the examples in FIGS. 7 and 8.

According to the connecting apparatus 10, such an effect as follows can be brought about.

Since the contacts 28 are maintained to be stable, electrical short circuit between the contacts is surely prevented though the structure of the needle retainer 30 is simple, thereby facilitating the manufacture of the connecting apparatus 10.

The device under test 12 is correctly disposed in the connecting apparatus 10, and the electrodes of the device under test 12 are surely brought into contact with the front end portion 52 of the contact 28.

When the contact 28 elastically deforms the needle retainer 30, a predetermined needle pressure can act between the conductive portion 24 and the contact 28, thereby causing the scraping action to act effectively on the electrode 16.

The present invention is not limited to the above embodiments but can be modified variously.

What is claimed is:

1. A plate-like contact for connecting an electrically conductive portion formed on a base plate and an electrode of a device under test to be inspected, comprising:

a principal portion having a front end side, a rear end side, a constant thickness dimension, an outer face curved and directed toward said conductive portion, a front end portion continuous to the front end side and extending upward or obliquely upward from the front end side by an amount greater than or equal to the thickness dimension, and a rear end portion continuous to the rear end side;

wherein said front end portion comprises an upwardly curved lower front end region and an upper front end region that extends upwardly and substantially vertically from said curved lower front end region; and wherein said upper front end region has an arc-shaped front end face extending in front-back direction or obliquely front-back direction so as to receive said device under test, the upper front end region projecting upward and having a constant width dimension in the front-back direction or the obliquely front-back direction, the constant width dimension being less than or equal to the thickness dimension.

2. The contact claimed in claim 1, wherein said front end face has a radius of curvature less than or equal to the thickness dimension of the principal portion.

3. An electrical connecting apparatus assembled into a base plate and for electrically connecting conductive portions formed on said base plate and electrodes of a device under test, comprising:

a housing including a groove-like recess extending in a right-left direction within a horizontal plane to open downward and a plurality of slits extending in the front-back direction within the horizontal plane at intervals in the right-left direction, the slits being communicated on the rear end side with said recess and opened at least up-down direction;

a plurality of contacts claimed in any one of claims 1 and 2, the outer face of each contact being directed toward said conductive portion, said principal portion being received in said recess and slit, said front end portion being projected upward or obliquely upward from said slit so that said front end portion may be pressed relatively against said electrode, and said rear end portion being located in said recess, and a needle retainer disposed in said recess and abutting a position on a side opposite to said outer face of said contact so as to bring a part of said outer face of said contact into contact with said conductive portion.

4. The electrical connecting apparatus claimed in claim 3, wherein said recess includes at least a rear-side inward face having an inclined face inclined to both of the horizontal plane and the vertical plane such that the upper becomes forward, and wherein the rear end portion of each contact has a rear end directed toward the rear-side inward face and abutting the inclined face at least partially.

5. The electrical connecting apparatus claimed in claim 4, wherein the rear end of each contact has an inclined face opposite to the inclined face of said rear-side inward face and inclined to both of the horizontal plane and the vertical plane such that the upper becomes forward.

6. The electrical connecting apparatus claimed in claim 5, wherein the inclined face of said rear-side inward face and the inclined face of each contact are made to abut each other in a state that said front end face and said electrode are not pressed, and wherein a lower corner portion of the rear end of each contact is curved like an arc.

7. The electrical connecting apparatus claimed in claim 5, wherein the rear-side inward face of said recess further has a falling preventing portion for preventing said contact from falling out of said recess cooperatively with the rear end portion of each contact above said inclined face of the rear-side inward face.

8. The electrical connecting apparatus claimed in claim 7, wherein said falling preventing portion includes an engaging face withdrawn from the upper end of said inclined face thereof such that the upper becomes rearward, and wherein the rear end of each contact has a convex portion projecting rearward so as to engage with said engaging face at an upper portion of the inclined face of said contact.

9. An electrical connecting apparatus assembled into a base plate and for electrically connecting conductive portions formed on the base plate and electrodes of a device under test, comprising:

a housing including a groove-like recess extending in a right-left direction within a horizontal plane to open downward and a plurality of slits extending in the front-back direction within the horizontal plane at intervals in the right-left direction, the slits being communicated on the rear end side with said recess and opened at least up-down direction;

a plurality of plate-like contacts respectively arranged in said housing and for connecting electrically said conductive portion and said electrodes, each contact having a thickness dimension, and each contact being provided with a principal portion received in said recess and said slit and having an outer face curved and directed toward said conductive portion, a front end portion continuous to a front end side of said principal portion and projecting upward or obliquely upward from said slit by an amount greater than or equal to the thickness dimension so as to be relatively pressed against said electrode, and a rear end portion continuous to a rear end side of said principal portion and located in said recess; and a needle retainer disposed in said recess and abutting a position on the side opposite to said outer face of each contact so as to bring a part of the outer face of said contact into contact with said conductive portion;

wherein the front end portion of each contact comprises an upwardly curved lower front end region and an upper front end region that extends upwardly and substantially vertically from said curved lower front end region; and wherein said upper front end has an arc-shaped front end face exending in the front-back direction or obliquely forward and backward so as to receive the device under test, the upper front end region projecting upward and having a constant width dimension in the front-back direction or the obliquely forward and backward direction, the constant width dimension being less than or equal to the thickness dimension.

\* \* \* \* \*